United States Patent [19]

Hirasawa

[11] Patent Number: 5,792,590
[45] Date of Patent: *Aug. 11, 1998

[54] PATTERN FORMATION METHOD

[75] Inventor: Satomi Hirasawa, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 843,313

[22] Filed: Apr. 15, 1997

Related U.S. Application Data

[63] Continuation of Ser. No. 426,953, Apr. 24, 1995, abandoned.

[30] Foreign Application Priority Data

Apr. 22, 1994 [JP] Japan .................................. 6-084240

[51] Int. Cl.$^6$ ........................................................ G03C 5/00
[52] U.S. Cl. ............................ 430/296; 430/325; 430/326; 430/330; 430/270.1; 430/942
[58] Field of Search ...................................... 430/296, 942, 430/325, 326, 330, 270.1

[56] References Cited

FOREIGN PATENT DOCUMENTS 4-204848  7/1992  Japan .

*Primary Examiner*—Geraldine Letscher
*Attorney, Agent, or Firm*—Young & Thompson

[57] ABSTRACT

A pattern formation method of an EB resist film having the chemical amplification property, which enables to form a desirable pattern without using an additional film and without decreasing the resolution. After an EB resist film with the chemical amplification property is formed on or over a supporting member, the resist film is contacted with an acid gas to absorb the gas on the surface area thereof. The absorbed acid gas exhibits a catalyst action to compensate the lost catalyst action of the exposure-generated acid, preventing the dissolution rate of the resist film from decreasing in a developer solution. The gas absorption process may be carried out before and/or after an EB exposure process of the resist film, and may be carried out simultaneously with the EB exposure process. As the acid gas to be absorbed, HCl, HBr, $H_2O_2$ or $H_2SO_4$ is preferably used.

20 Claims, 7 Drawing Sheets

PATTERN FORMATION METHOD

This application is a continuation of application Ser. No. 08/426,953, filed Apr. 24, 1995, now abandoned.

BACKGROUND OF THE INVENTION

1. Field of the Invention

The present invention relates to a pattern formation method and more particularly, to a pattern formation method of an electron-beam resist with a chemical amplification property.

2. Description of the Prior Art

Progress or improvement of lithography techniques is indispensable to fine pattern formation for fabricating large-scale integrated circuits (LSIs) that have been increasing in integration scale. Therefore, various resists with the chemical amplification properties capable of both high-sensitivity and high-resolution and various exposure processes using exposing radiations such as ultraviolet (UV) light, far ultraviolet (FUV) light, an electron-beam (EB) and an X-ray have been investigated and developed.

A positive resist of this type contains, in general, an acid generator and an acid-degradative polymer. The acid generator generates a given acid at exposed regions of the resist due to radiation energy during an exposure process. The acid thus generated acts as a catalyst for reactions such as cross-linking between the molecules, bond-breakage or degradation and decomposition of the acid-degradative polymer.

The above reactions further generate the same acid from the acid generator and then, the acid thus newly-generated acts as the catalyst to promote the above reactions. Thus, the above reactions successively occur like a chain, and as a result, the molecular weight of the acid-degradative polymer decreases.

The resist is then subjected to a heat-treatment process termed a "post-bake" or "post-exposure bake (PEB)" process to promote the above reactions further, producing further molecular-weight decrease of the polymer.

A negative resist of this type contains, in general, an acid generator, an acid-reactive monomer and an acid-polymerizing polymer. Similar to the positive one, the acid generator generates a given acid at exposed regions of the resist due to radiation energy during an exposure process. The acid thus generated acts as a catalyst for reactions such as cross-linking between the molecules, bond-breakage or degradation and decomposition of the acid-reactive monomer and the acid-polymerizing polymer.

The above reactions further generate the same acid from the acid generator and then, the acid thus newly generated acts as the catalyst to promote the above reactions. Thus, the above reactions successively occur like a chain, and as a result, the molecular weight of the acid-polymerizing polymer increases.

As described above, with the positive and negative resists of this type, the effect of the radiation exposure to the resist is chemically amplified by the acid generated by the acid generator, resulting in a desirable, fine pattern on the resist.

With the EB resist of this type, in a practical fabrication process sequence of the LSI, the resist is coated on or over a semiconductor wafer and is exposed to an EB during the exposure process, which is carried out in a vacuum chamber of an EB exposure system. After this exposure process, the wafer coated with the EB resist is taken out of the vacuum chamber, and then subjected to the PEB process in the atmosphere.

Subsequently, the EB resist is subjected to a development process using an organic alkali developer solution. Since the low molecular-weight regions, i.e., the unnecessary regions, of the resist are soluble in the developer solution, they dissolve in the solution to be removed, resulting in a desired pattern of the resist.

In the case of a positive one, the exposed regions to the EB dissolve in the developer solution to be removed. In the case of a negative one, the unexposed regions dissolve in the solution to be removed.

As described above, since the EB resist with the chemical amplification property amplifies the effect of the EB exposure, the resist enables to realize a higher sensitivity than a conventional EB resist composed of a quinonediazide-containing EB-active compound and a novolac resin.

Also, since a slight exposure to the EB enables to realize a higher sensitivity, an optimum EB resist can be selected from more EB resist materials of this type than the case of the other types of the conventional EB resists. This means that a higher-resolution EB resist can be selected therefrom.

Therefore, it has been said that the EB resist with the chemical amplification property is not only of high-sensitivity but also of high-resolution.

With the conventional pattern formation method using the EB resist of this type, as described above, a semiconductor wafer coated with the EB resist must be taken out of the vacuum chamber of the EB exposure system after the exposure process, and then, the wafer must be subjected to the PEB process in the atmosphere.

As a result, the exposed resist is contacted with the atmosphere so that a given acid generated in the exposed regions of the resist reacts with the atmosphere to lose its catalyst action. The phenomenon is termed the "deactivation" of the acid.

It has been said that the deactivation is caused by $O_2$ and/or $CO_2$ contained in the atmosphere. However, more recently, it has been found that the deactivation is caused by a base or bases and/or moisture contained in the atmosphere.

Once the deactivation of the acid occurs, the chain reactions such as cross-linking, bond-breakage and decomposition of the acid-degradative or acid-polymerizing polymer do not progress satisfactorily, so that a desirable molecular-weight change of the resist material does not take place. This causes the dissolution rate change of the resist material in a developer solution at the surface area of the resist film, resulting in deterioration of the resist pattern.

Specifically, in the case of the positive one, a resultant resist pattern tends to be oversized, in other words, a portion to be removed tends to be left. Therefore, the resultant resist pattern has a T-shaped cross section. Similarly, in the case of the negative one, a resultant resist pattern tends to be undersized, in other words, a portion not to be removed also tends to be removed. Therefore, the resultant resist pattern has an inverse T-shaped cross section.

Thus, both the positive and negative ones of this type do not produce a desirable, fine resist pattern, which means a reduction of an obtainable resolution of the resist.

It is known that the resolution reduction changes dependent upon the period of time from the end of the EB exposure process to the start of the PEB process, which is about 30 minutes to one hour.

To solve the problem of resolution reduction, an improved pattern formation method was developed, which is disclosed in the Japanese Non-Examined Patent Publication No.

4-204848 (July, 1992). This conventional method employs as a protection film a water-soluble polymer film that covers the resist film, and is described below referring to FIGS. 1A to 1F.

First, an EB resist having the chemical amplification property is coated on or over a semiconductor wafer 61, producing an EB resist film 62 as shown in FIG. 1A. The resist film 62 is then subjected to a known pre-bake or pre-exposure bake process.

Next, a water-soluble polymer material, which does not mix with the resist film 62, is coated on the resist film 62, forming a protection film 70 thereon, as shown in FIG. 1B.

The EB resist film 62 thus covered with the protection film 70 is selectively exposed to an EB 56 through the protection film 70 in a vacuum chamber of an EB exposure system. Through this exposure process, as shown in FIG. 1C, given regions 62A of the resist film 62 are exposed to the EB 56 and a given acid is generated in the exposed regions 62A.

The resist film 62 thus exposed is taken out from a vacuum chamber to the atmosphere without removing the protection film 70. The protection film 70 is removed just before a PEB process as shown in FIG. 1D, and then, is subjected to the PEB process, as shown in FIG. 1E.

Finally, the resist film 62 thus subjected to the PEB process is developed. The exposed regions 62A of the resist film 62 are selectively removed during the development process, so that penetrating windows 62B are formed at corresponding positions to the regions 62A, respectively, as shown in FIG. 1F.

Thus, a desirable pattern is formed on the resist film 62.

With the conventional pattern formation method shown in FIGS. 1A to 1F, since the EB resist film 62 is scarcely contacted with the atmosphere due to the protection film 70 after the wafer 61 is taken out from the vacuum chamber, the deactivation of the acid generated in the exposed regions 62A is ensured to be prevented.

However, this method additionally needs the formation and removal processes of the protection film 70, so that a problem that the process sequence of the pattern formation becomes longer arises.

Also, the electron applied to the resist film 62 is scattered by the film 62, and such the electron scattering phenomenon affects the resolution of the resist film 62. As the resist film 62 becomes thicker, the electron scattering becomes heavier. Therefore, in view of the resolution, it is necessary that the resist film 62 is formed as thin as possible.

However, the conventional method shown in FIGS. 1A to 1F additionally requires the protection film 70. Therefore, the total thickness of the resist and protection films 62 and 70 become larger than the thickness of the resist film 62 itself. This causes another problem of reduction of inherent resolution of the resist film 62.

SUMMARY OF THE INVENTION

Accordingly, an object of the present invention is to provide a pattern formation method that enables to form a desirable pattern of an EB resist having the chemical amplification property without using an additional film such as the protection film above and without decreasing the resolution.

A pattern formation method according to the present invention includes a step of exposing an EB resist film to an EB to generate a first acid at exposed regions of the resist film, which is termed an exposure process, and a step of contacting the resist film with an acid gas so that the acid gas is absorbed on the film, which is termed an absorption process.

The resist film has a chemical amplification property and is formed on or over a supporting member. The acid gas absorbed on the resist film produces a second acid to compensate an action of said first acid to be lost due to deactivation.

The absorption process may be carried out before and/or after the exposure process, and it may be carried out simultaneously with the exposure process.

As the acid gas to be absorbed, any acid gas may be used. However, hydrogen chrolide (HCl), hydrogen bromide (HBr), hydrogen peroxide ($H_2O_2$) or sulfuric acid ($H_2SO_4$) are preferably used, because theses gases do not damage the resist film and are readily available.

As the EB resist film, any EB resist may be used if it has the chemical amplification property. Also, the resist film may be positive or negative.

As the supporting member, any member may be used if it can support the resist film. This member contains, in general, a semiconductor substrate or wafer, and it may further contain at least one conductor or insulator film/layer formed on or over the wafer.

With the pattern formation method of the present invention, the EB resist film absorbs the acid gas to produce the second acid. Therefore, even if the first acid generated by the exposure loses its action due to the deactivation phenomenon, the second acid exhibits an action to compensate the lost action of the first acid.

As a result, a desirable resist pattern can be formed on the resist film without using an additional film such as the protection film shown in the conventional method.

Also, since no additional film is employed, an obtainable resolution does not decrease.

To carry out the method of the invention, an EB exposure system may be used, which contains an exposure chamber for exposing an EB resist film having the chemical amplification property to an EB, and an electron optical system for producing the EB and for applying the EB thus produced to the resist film in the exposure chamber.

This system further contains a gas-introducing structure for introducing an acid gas into the exposure chamber.

The EB resist film is formed on a supporting member, which is similar to that used in the method of the first aspect.

During an exposure process, the supporting member with the resist film is placed on a stage provided in the exposure chamber. The acid gas is introduced into the exposure chamber by the gas-introducing structure to be absorbed on the resist film during an absorption process.

The absorption process may be carried out before and/or after the exposure process, and it may be carried out simultaneously with the exposure process.

In the system, an absorption chamber may be additionally provided adjacent to the exposure chamber. In this case, the gas-introducing structure is made so that the acid gas is introduced into the absorption chamber instead of the exposure chamber.

The supporting member with said resist film is placed in a stage provided in the absorption chamber so that the resist film absorbs the acid gas introduced into the absorption chamber by said gas-introducing structure during an exposure process.

The exposure process is carried out in the exposure chamber. Since the absorption process is carried out in the absorption chamber, the acid gas is not necessary to be introduced into the exposure chamber.

When such the EB exposure system as above is used for the method of the invention, the resist film absorbs the acid gas in the exposure chamber or the absorption chamber as necessary. Therefore, even if the first acid generated by the exposure loses its action due to the deactivation phenomenon, the second acid exhibits an action to compensate the lost action of the first acid.

As a result, a desirable resist pattern can be formed on the resist film without using an additional film such as the protection film shown in the conventional method and without resolution decrease.

DESCRIPTION OF THE PREFERRED EMBODIMENTS

First Embodiment

Figure 1A:
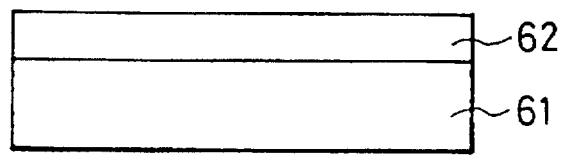
FIGS. 1A to 1F show a process sequence of a conventional pattern formation method of an EB resist film, respectively.
Figure 1B:
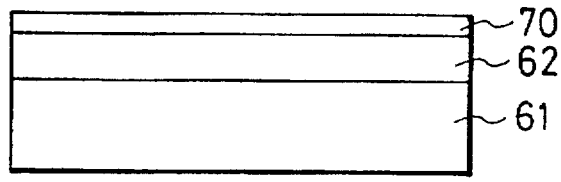
Figure 1C:
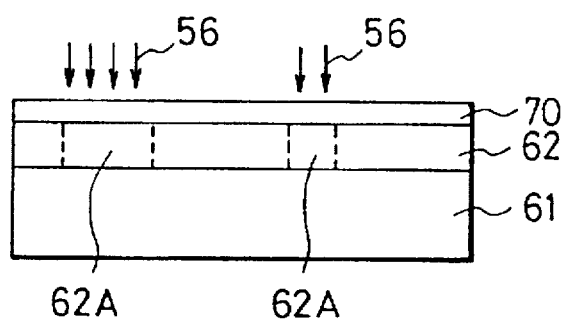
Figure 1D:
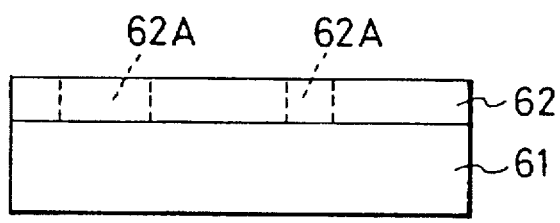
Figure 1E:
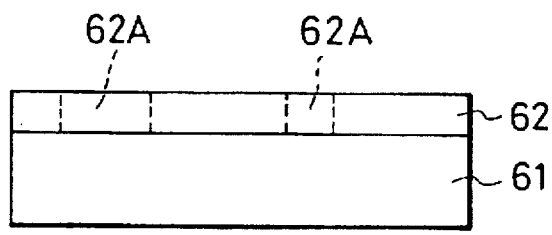
Figure 1F:
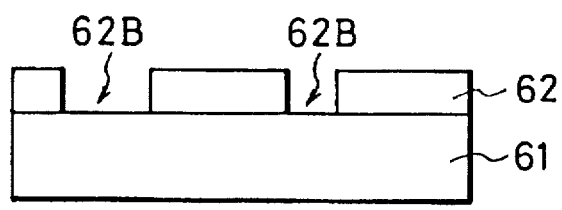
Figure 2:
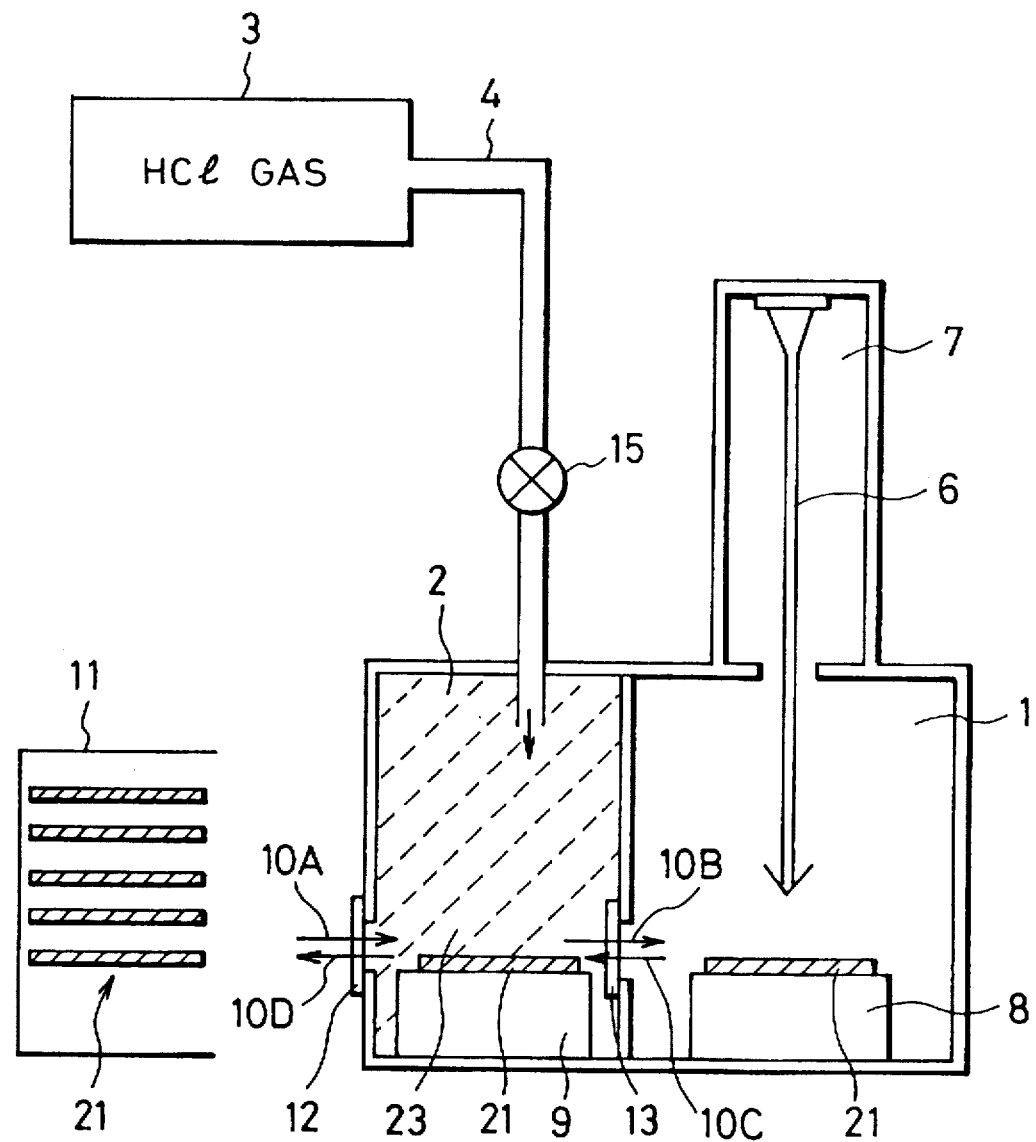
FIG. 2 is a schematic cross-sectional view of an EB exposure system, which is used for a pattern formation method of a resist film according to a first embodiment of the present invention.

A pattern formation method according to a first embodiment of the invention is carried out using an EB exposure system shown in FIG. 2. This system has the following structure.

As shown in FIG. 2, an exposure chamber 1 contains a wafer stage 8 and an electron optical system 7. A semiconductor wafer 21 covered with an EB resist film 22 (see FIG. 2) is placed on the wafer stage 8 during an exposure process. The electron optical system 7 produces an EB 6 and applies the EB 6 to the resist film 22 during the exposure process.

The electron optical system 7 has an electron gun, an electron lens system and EB deflectors, which are not shown in FIG. 2.

A wafer-exchange chamber 2, which acts an absorption chamber also, is provided adjacent to the exposure chamber 1. The chamber 2 includes a wafer stage 9 on which the semiconductor wafer 21 with the EB resist film 22 is placed for exchange prior to the exposure process and after the exposure process.

A gas container 3 is provided to be connected to the wafer-exchange chamber 2 through a gas line 4. A valve 15, which is provided at the gas line 4, opens or closes the line 4 as necessary. The gas container 3 stores the HCl gas therein as an acid gas.

During the exposure process, the air in the exposure chamber 1 is pumped out by a vacuum pump system (not shown) so that the chamber 1 assumes a high-level vacuum condition such as $10^{-5}$ to $10^{-6}$ Torr. If the pressure is higher than $10^{-5}$ Torr, fluctuation of the EB 6 tends to occur. A pressure lower than $10^{-6}$ Torr is difficult to be realized due to the ability limit of vacuum pump system.

Also, the air in the wafer-exchange chamber 2 is pumped out by another vacuum pump system (not shown) and at the same time, the HCl gas is introduced into the wafer-exchange chamber 2 from the container 3, resulting in a low-level vacuum condition such as $10^{-3}$ to $10^{-4}$ Torr. If the pressure is higher than $10^{-3}$ Torr, it becomes difficult to introduce the HCl gas 23 is difficult to be into the wafer-exchange chamber 2. If the pressure is lower than $10^{-4}$ Torr, the HCl gas 23 is difficult to be absorbed on the resist film 22.

A wafer carrier 11 for holding and carrying a plurality of the semiconductor wafers 21 covered with the resist film 22 is provided outside of the EB exposure system.

A gate valve 12 is provided at the outer wall of the wafer-exchange chamber 2, so that the wafers 21 held in the wafer carrier 11 are moved along an arrow 10A into the wafer-exchange chamber 2 through the opened gate valve 12 to be placed on the wafer stage 9, successively. The wafer 21 exposed to the EB 6 in the exposure chamber 1 and placed on the wafer stage 9 is moved along an arrow 10D to the wafer carrier 11 to be held therein.

Similarly, a gate valve 13 is provided at a partition wall of the exposure chamber 1 and the wafer-exchange chamber 2, so that the wafer 21 placed on the wafer stage 9 in the wafer-exchange chamber 2 is successive moved along an arrow 10B into the exposure chamber 1 through the opened gate valve 13 to be placed on the wafer stage 8. Contrarily, the wafer 21 placed on the wafer stage 8 and exposed to the EB 6 is moved along an arrow 10C to the wafer stage 9 through the opened gate valve 13.

Moving and placement of the wafer 21, opening and closing of the gate valves 15, 12 and 13, and exposure of the resist film 22 to the EB 6 are controlled by a control system (not shown).

With the EB exposure system shown in FIG. 2, the wafer-exchange chamber 2 is provided and the wafer carrier 11 is additionally used, the system is proper for pattern formation on a large-scale.

Since the HCl gas is introduced into the wafer-exchange chamber 2, not into the exposure chamber 1, contamination and/or corrosion of the resist film 22 in the exposure chamber 1 is prevented, and the EB 6 is not affected by the vacuum level decrease in the exposure chamber 1 due to the HCl gas.

Further, because the EB resist film 22 may be exposed to the HCl gas 23 in the wafer-exchange chamber 2 before and/or after the EB exposure process, the resist film 22 can sufficiently absorb the gas 23 at its surface. Therefore, even if an acid generated by the exposure to the EB 6 in exposed regions of the resist film 22 loses its catalyst action due to the deactivation phenomenon, the HCl gas 23 absorbed on the resist film 22 ensures to compensate the catalyst action thus lost. As a result, a desirable pattern can be formed on the resist film 22 without using an additional film. Also, an obtainable resolution does not decrease.

A latent image is formed in the resist film 22 by the exposure-generated acid, and another acid generated by the absorbed HCl gas 23, which is a compensating acid, only compensates the lost catalyst action of the acid. Therefore, the absorption of the HCl gas 23 on the resist film 22 does not hinder the pattern formation.

The compensating acid is generated on the surface area of the resist film 22 by the absorbed HCl gas 23 and does not go into the film 22 deeper, and therefore, it is not essential for the absorption period of time of the gas 23 to be controlled strictly. However, it is proper for the resist film 22 concerned to be exposed to the HCl gas 23 in the wafer-exchange chamber 2 during the exposure process of the previous or subsequent one of the resist films 22.

Next, the pattern formation method according to the first embodiment is described below referring to FIGS. 3A to 3F. This method is carried out by the following process sequence using the EB exposure system in FIG. 1.

(wafer preparation process)

Figure 3A:
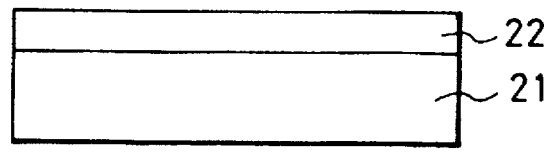
FIGS. 3A to 3F show a process sequence of the pattern formation method according to the first embodiment, respectively.

First, a positive EB resist with a chemical amplification property is coated on or over the semiconductor wafer 21, producing the resist film 22 with a thickness of 0.7 µm, as shown in FIG. 3A. This coating process is repeated to prepare a plurality of the wafers 21 with the resist films 22.

The positive EB resist contains an acid-generator and an acid-degradative polymer.

(pre-bake process)

Then, the wafers 21 are placed on a hot plate (not shown) to carry out a known pre-bake process for the resist films 22 at 90° C. for 60 seconds. The wafers 21 thus pre-baked are held in the wafer carrier 11.

(first gas absorption process)

Figure 3B:
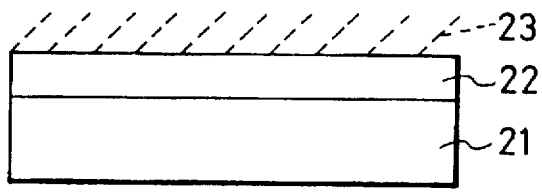

Next, a first one of the wafers 21 in the carrier 11 is moved into the wafer-exchange chamber 2 through the opened gate 12 to be placed on the stage 9. Prior to this movement, the HCl gas 23 (concentration: 100%) is introduced into the chamber 2 and the chamber 2 is in a low-level vacuum condition, and therefore, the wafer 22 thus placed is contacted with the gas 23. Thus, the HCl gas 23 is absorbed on the surface area of the resist film 22, as shown in FIG. 3B.

The contact or absorption period of time of the resist film 22 is so set that the gas 23 of a desirable amount is absorbed on the resist film 22, which is typically one to five minutes.

(exposure process)

Figure 3C:
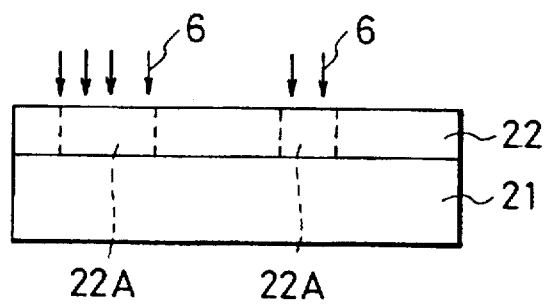

The wafer 21 with the resist film 22 thus absorbed is then moved into the exposure chamber 1 through the opened gate 13 to be placed on the stage 8. The chamber 1 is kept in a high-level vacuum condition. The resist film 22 is selectively exposed to the EB 6, producing exposed regions 22A therein, as shown in FIG. 3C. The absorbed HCl gas 23 causes no problem on the EB exposure due to the above-mentioned reason.

(second gas absorption process)

Figure 3D:
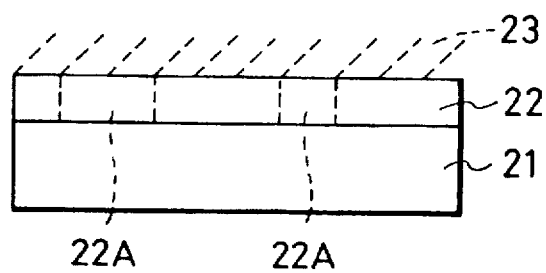

The wafer 21 with the resist film 22 thus exposed is moved again into the wafer-exchange chamber 2 to be placed on the stage 9. Since the HCl gas 23 is kept in the chamber 2, the exposed resist film 22 absorbs the gas 23 again on its surface area, as shown in FIG. 3D.

The wafer 21 with the resist film 22 thus gas-absorbed twice is moved out of the wafer-exchange chamber 2 through the opened gate 12 to the atmosphere. Thus, a plurality of the wafers 21 with the resist film 22 gas-absorbed twice are held in the carrier 11.

(post-exposure bake process)

Figure 3E:
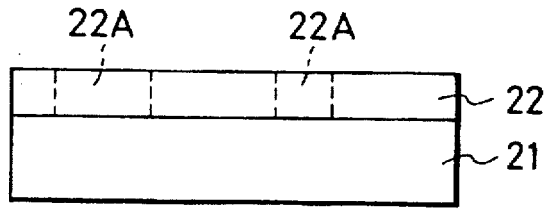

The wafers 21 held in the carrier 11 are placed on a hot plate (not shown) to carry out a known PEB process for the resist films 22 at 100° C. for 60 seconds, as shown in FIG. 3E. Since the resist film 22 contained the HCl gas 23 at its surface area, the acid ($H^+$) generated in the film 22 by the EB exposure acts as a catalyst for the chemical reaction of the resist film 22 in the presence of the given acid generated by the compensating HCl gas. Since the given reaction of the resist film 22 is finished during the PEB process, the problem due to the deactivation of the exposure-generated acid does not occur during the period of time between the end of the PEB process and the start of the development process.

(development process)

Figure 3F:
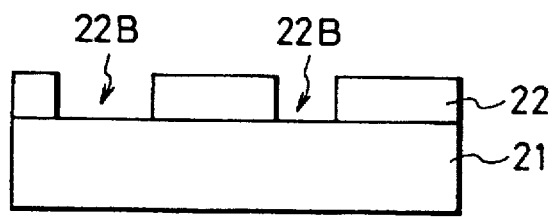

Finally, the resist film 22 is developed by a given organic alkali developer solution so that the exposed regions 22A are dissolved in the solution, resulting in penetrating windows 22B formed in the resist film 22 at corresponding positions to the exposed regions 22A, as shown in FIG. 3F. The absorbed HCl gas 23 does not affect in this development process also. The redundant acids are dissolved in the developer solution to be removed from the resist film 22.

Through the above process sequence a desirable pattern of the resist film 22 can be obtained, each of the penetrating windows 22B having vertical walls and not having a T-shaped cross section.

The inventor's test states that a resultant pattern of the resist film realized penetrating windows with vertical walls, resulting in a line width of 0.25 µm. Also, the line width was able to be formed within an accuracy of ±0.02 µm, which was kept not only in the single wafer but also between the wafers.

If the resist film 22 patterned by the method of the first embodiment is used as a mask for selectively etching an underlying conductor or insulator film, the conductor or insulator film is finely patterned with superior accuracy.

One of the first and second gas absorption processes may be cancelled to reduce the working hours of the method.

Second Embodiment

Figure 4:
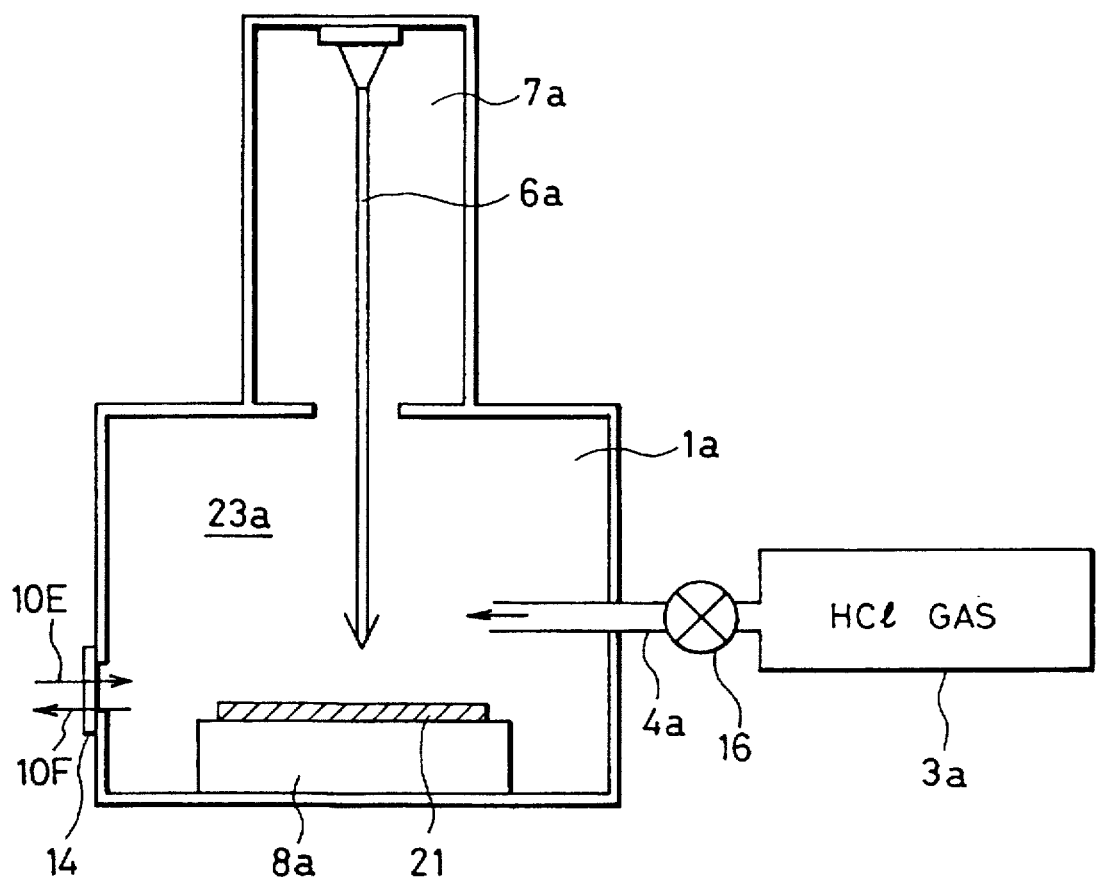
FIG. 4 is a schematic cross-sectional view of another EB exposure system, which is used for pattern formation methods according to second, third and fourth embodiments of the present invention.

A pattern formation method according to a second embodiment of the invention is carried out using an EB exposure system shown in FIG. 4. This system has the following structure.

As shown in FIG. 4, an exposure chamber 1a contains a wafer stage 8a and an electron optical system 7a. A semiconductor wafer 21 covered with an EB resist film 22 (see FIG. 5) is placed on the wafer stage 8a during an exposure process and an absorption process. The electron optical system 7a produces an EB 6a and applies the EB 6a to the resist film 22 during the exposure process.

The electron optical system 7a has an electron gun, an electron lens system and EB deflectors, which are not shown in FIG. 4.

A gas container 3a is provided to be connected to the exposure chamber 1a through a gas line 4a. A valve 16, which is provided at the gas line 4a, opens or closes the line 4a as necessary. The gas container 3a is storing a HCl gas 23a therein as an acid gas.

No wafer-exchange chamber 2 is provided in the second embodiment and the HCl gas 23a is introduced into the exposure chamber 1a. Therefore, the exposure chamber acts an absorption chamber also. This system is simpler in structure than the system of the first embodiment, which is an advantage.

A gate valve 14 is provided at the wall of the exposure chamber 1, so that the wafers 21 held in the wafer carrier (not shown) are moved along an arrow 10E into the chamber 1a through the opened gate valve 14 to be placed on the wafer stage 8a, successively. The wafer 21 exposed to the EB 6 is moved along an arrow 10F to be out of the chamber 1a and is held in the wafer carrier.

The air in the exposure chamber 1a is pumped out by a vacuum pump system (not shown) so that the chamber 1 becomes in a high-level vacuum condition (for example, $10^{-5}$ to $10^{-6}$ Torr).

Also, since the HCl gas 23a is introduced into the chamber 1a from the container 3a, the air in the exposure chamber 1a is pumped out by the vacuum pump system and at the same time, the gas 23a can be introduced into the chamber 1a, resulting in a low-level vacuum condition (for example, $10^{-3}$ to $10^{-4}$ Torr).

A wafer carrier 11 for holding and carrying a plurality of the semiconductor wafers 21 covered with the resist film 22 is provided outside of the EB exposure system.

Moving and placement of the wafer 21, opening and closing of the valves 14 and 16, and exposure of the resist film 22 to the EB 6a are controlled by a control system (not shown).

With this system, the EB resist film 22 may be exposed to the HCl gas 23a in the exposure chamber 1a before and/or after the EB exposure process. The resist film 22 may be exposed to the gas 23a simultaneously with the exposure to the EB 6a.

Next, the pattern formation method according to the second embodiment is described below referring to FIGS. 5A to 5D. This method is carried out by the following process sequence using the EB exposure system in FIG. 3.
(wafer preparation process)

Figure 5A:
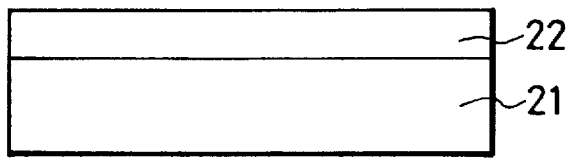
FIGS. 5A to 5D show a process sequence of the pattern formation method according to the second embodiment, respectively.

First, a positive EB resist with a chemical amplification property is coated on or over the semiconductor wafer 21, producing the resist film 22 with a thickness of 0.7 μm, as shown in FIG. 5A. This coating process is repeated to prepare a plurality of the wafers 21 with the resist films 22.
(pre-bake process)

Then, the wafers 21 are placed on a hot plate (not shown) to carry out a known pre-bake process for the resist films 22 at 90° C. for 60 seconds. The wafers 21 thus pre-baked are held in the wafer carrier.
(gas absorption and exposure process)

Next, a first one of the wafers 21 in the carrier is moved into the exposure chamber 2 through the opened gate 14 to be placed on the stage 8a. Prior to this movement, the HCl gas 23a is introduced into the chamber 1a from the container 3a and at the same time, the air in the chamber 1a is pumped out by the vacuum pump system, resulting in a low-level vacuum condition. The concentration of the HCl gas 23a is controlled to be a given value.

The rest film 21 is contacted when the HCl gas 23a to absorb the gas 23 on the surface area of the film 22, as shown in FIG. 3B.

Figure 5B:
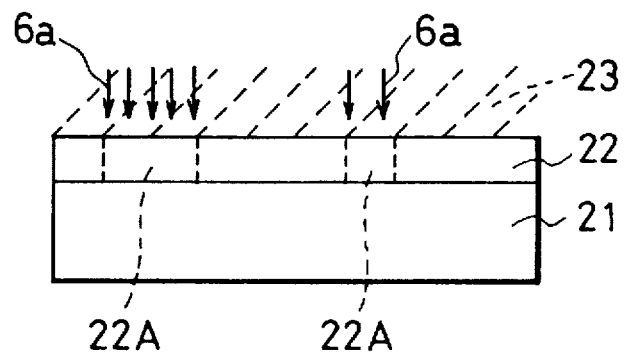

Then, the resist film 22 is selectively exposed to the EB 6a, producing exposed regions 22A therein, as shown in FIG. 5B. The absorbed HCl gas 23a causes no problem on the EB exposure due to the above-mentioned reason.

The wafer 21 with the resist film 22 thus gas-absorbed and EB-exposed is moved out of the exposure chamber 1a through the opened gate 14 to the atmosphere. Thus, a plurality of the wafers 21 with the resist film 22 gas-absorbed and EB-exposed are held in the carrier.
(post-exposure bake process)

Figure 5C:
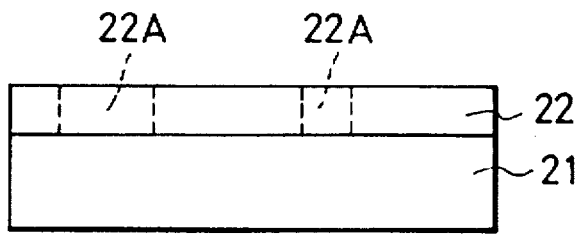

The wafers 21 held in the carrier are placed on a hot plate (not shown) to carry out a known PEB process for the resist films 22 at 100° C. for 60 seconds, as shown in FIG. 5C. The given reaction of the resist film 22 is finished during the PEB process.
(development process)

Figure 5D:
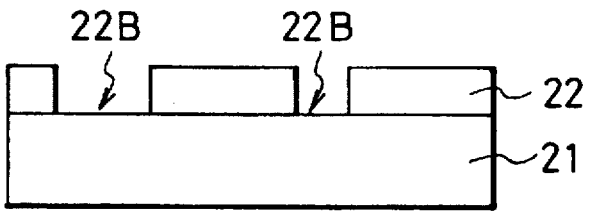

Finally, the resist film 22 is developed by a given organic alkali developer solution so that the exposed regions 22A are dissolved in the solution, resulting in penetrating windows 22B formed in the resist film 22 at corresponding positions to the exposed regions 22A, as shown in FIG. 5D.

Through the above process sequence similar to the first embodiment, a desirable pattern of the resist film 22 can be obtained. Each of the penetrating windows 22B has vertical walls and does not have a T-shaped cross section.

In the method of the second embodiment, the same effect as that of the first embodiment is obtained.

The concentration of the HCl gas 23a and the vacuum level in the exposure chamber 1a are necessary to be controlled precisely. However, since the absorption of HCl gas 23a and the exposure to the EB 6a are carried out simultaneously, there is an additional advantage of shorter working hours for the pattern formation than the method of the first embodiment.

Third Embodiment

Figure 6A:
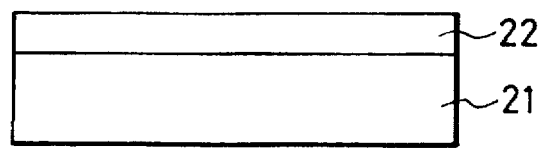
FIGS. 6A to 6E show a process sequence of the pattern formation method according to the third embodiment, respectively.

The pattern formation method according to the third embodiment is described below referring to FIGS. 6A to 6E. This method is carried out by the following process sequence using the EB exposure system in FIG. 4.
(wafer preparation process) First, in the same way as that of the second embodiment, the positive EB resist film 22 with the chemical amplification property is formed on or over the semiconductor wafer 21, as shown in FIG. 6A. This coating process is repeated to prepare a plurality of the wafers 21 with the resist films 22.
(pre-bake process)

Then, the wafers 21 are subjected to the same pre-bake process as that of the second embodiment. The wafers 21 thus pre-baked are held in the wafer carrier.

Next, a first one of the wafers 21 in the carrier is moved into the exposure chamber 1a through the opened gate 14 to be placed on the stage 8a.
(gas absorption process)

The HCl gas 23a is then introduced into the chamber 1a from the container 3a and at the same time, the air in the chamber 1a is pumped out by the vacuum pump system, resulting in a low-level vacuum condition. The concentration of the HCl gas 23a is controlled to be a given value.

Figure 6B:
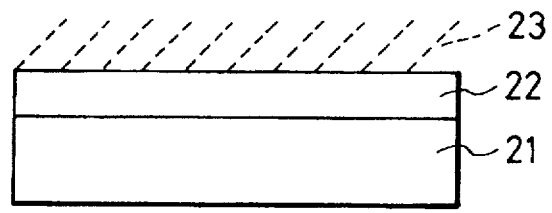

The resist film 21 is contacted with the HCl gas 23a to absorb the gas 23 on the surface area of the film 22, as shown in FIG. 6B.
(exposure process)

Subsequently, the valve 16 is closed to stop introducing the HCl gas 23a into the chamber 1a, and the air in the chamber 1a is kept to be pumped out, resulting in a high-level vacuum condition.

Figure 6C:
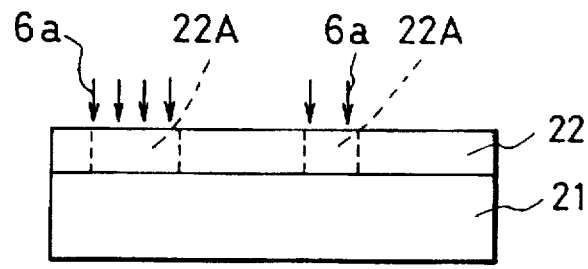

The resist film 22 is selectively exposed to the EB 6a in the high-level vacuum condition, producing exposed regions 22A therein, as shown in FIG. 6C. The absorbed HCl gas 23a causes no problem on the EB exposure due to the above-mentioned reason.

The wafer 21 with the resist film 22 thus gas-absorbed and EB-exposed is moved out of the exposure chamber 1a through the opened gate 14 to the atmosphere. Thus, a plurality of the wafers 21 with the resist film 22 gas-absorbed and EB-exposed are held in the carrier.
(post-exposure bake process)

Figure 6D:
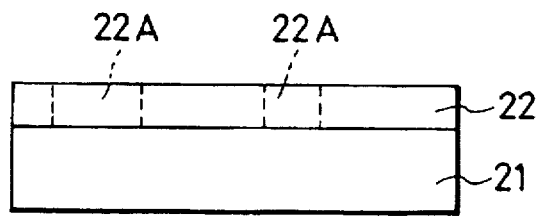

The wafers 21 held in the carrier are subjected to the same PEB process as that of the second embodiment for the resist films 22, as shown in FIG. 6D. The given reaction of the resist film 22 is finished during the PEB process.
(development process)

Figure 6E:
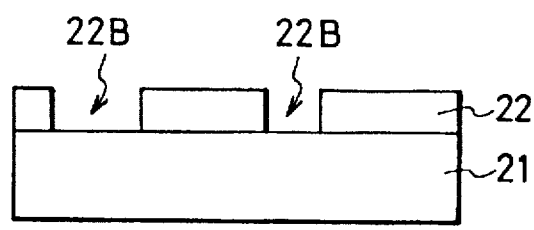

Finally, the resist film 22 is developed in the same way as that of the second embodiment, resulting in penetrating windows 22B formed in the resist film 22 at corresponding positions to the exposed regions 22A, as shown in FIG. 6E.

Through the above process sequence, similar to the first and second embodiments, a desirable pattern of the resist film 22 can be obtained. Each of the penetrating windows 22B has vertical walls and does not have a T-shaped cross section.

In the method of the third embodiment the same effect as that of the first embodiment is obtained.

Compared with the second embodiment, since the HCl absorption process and the exposure process are carried out separately, working hours for the pattern formation are longer than the method of the second embodiment. However, there is an additional advantage in that the exposure process can be carried out in an optimum vacuum-level condition without the effect of the HCl gas 23a, and in that the HCl gas 23a is more readily absorbed on the resist film 22, compared to case the second embodiment.

Fourth Embodiment

The pattern formation method according to the fourth embodiment is described below referring to FIGS. 7A to 7E. This method is carried out by the following process sequence using the EB exposure system in FIG. 4.
(wafer preparation process)

Figure 7A:
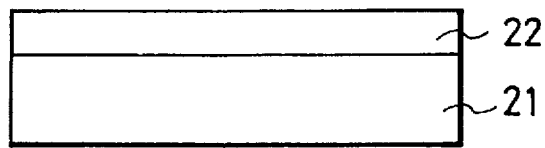
FIGS. 7A to 7E show a process sequence of the pattern formation method according to the fourth embodiment, respectively.

First, in the same way as that of the second embodiment, the positive EB resist film 22 with the chemical amplification property is formed on or over the semiconductor wafer 21, as shown in FIG. 7A. This coating process is repeated to prepare a plurality of the wafers 21 with the resist films 22.
(pre-bake process)

Then, the wafers 21 are subjected to the same pre-bake process as that of the second embodiment. The wafers 21 thus pre-baked are held in the wafer carrier.

Next, a first one of the wafers 21 in the carrier is moved into the exposure chamber 1a through the opened gate 14 to be placed on the stage 8a.
(exposure process)

Subsequently, while the valve 16 is kept closed not to introduce the HCl gas 23a into the chamber 1a, the air in the chamber 1a is pumped out by the vacuum pump system, resulting in a high-level vacuum condition.

Figure 7B:
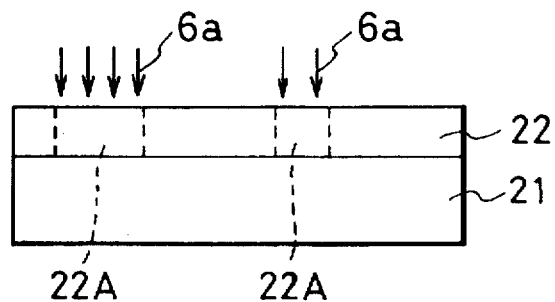

The resist film 22 is selectively exposed to the EB 6a in the high-level vacuum condition, producing exposed regions 22A therein, as shown in FIG. 7B. The HCl gas 23a is not absorbed on the resist film 22 in this stage.
(gas absorption process)

The valve 16 is opened to introduce the HCl gas 23a into the chamber 1a from the container 3a while the air in the chamber 1a is kept be pumped out by the vacuum pump system, resulting in a low-level vacuum condition. The concentration of the HCl gas 23a is controlled to be a given value.

Figure 7C:
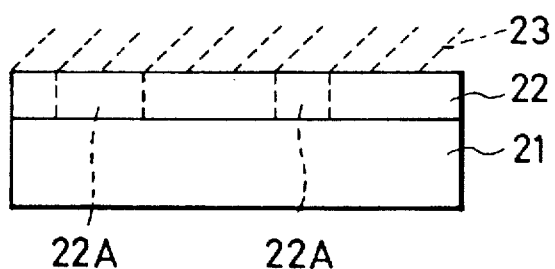

The resist film 21 is contacted with the HCl gas 23a to absorb the gas 23 on the surface area of the film 22, as shown in FIG. 7C.

The wafer 21 with the resist film 22 thus EB-exposed and gas-absorbed is moved out of the exposure chamber 1a through the opened gate 14 to the atmosphere. Thus, a plurality of the wafers 21 with the resist film 22 gas-absorbed and EB-exposed are held in the carrier.
(post-exposure bake process)

Figure 7D:
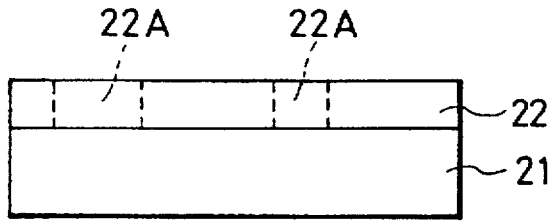

The wafers 21 held in the carrier are subjected to the same PEB process as that of the second embodiment for the resist films 22, as shown in FIG. 7D. The given reaction of the resist film 22 is finished during the PEB process.
(development process)

Figure 7E:
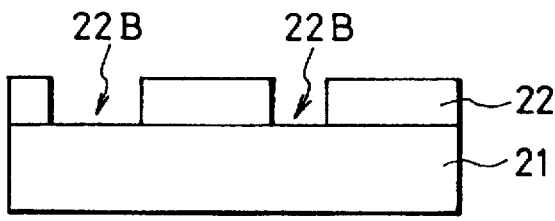

Finally, the resist film 22 is developed in the same way as that of the second embodiment, resulting in penetrating windows 22B formed in the resist film 22 at corresponding positions to the exposed regions 22A, as shown in FIG. 7E.

Through the above process sequence, similar to the first, second and third embodiments, a desirable pattern of the resist film 22 can be obtained. Each of the penetrating windows 22B has vertical walls and does not have a T-shaped cross section.

In the method of the fourth embodiment, the same effect as that of the first embodiment is obtained.

Compared with the second embodiment, similar to the third embodiment since the HCl absorption process and the exposure process are carried out separately, working hours for the pattern formation are longer than the method of the second embodiment. However, there is the same additional advantage as that of the third embodiment.

Fifth Embodiment

The pattern formation method according to the fifth embodiment is equivalent to the method of the first embodiment except that the EB exposure system shown in FIG. 4 is used.

Specifically, the wafer preparation process and the pre-bake process are carried out in the same way as those of the second embodiment (FIG. 3A).

Next, the valve 16 is opened to introduce the HCl gas 23a into the chamber 1a from the container 3a while the air in the chamber 1a is kept pumped out by the vacuum pump system, resulting in a low-level vacuum condition. The concentration of the HCl gas 23a is controlled to be a given value. The resist film 21 is contacted with the HCl gas 23a to absorb the gas 23 on the surface area of the film 22 (FIG. 3B).

Subsequently, while the valve 16 is closed to stop introducing the HCl gas 23a into the chamber 1a, the air in the chamber 1a is pumped out by the vacuum pump system, resulting in a high-level vacuum condition. The resist film 22 thus absorbed is selectively exposed to the EB 6a in the high-level vacuum condition, producing exposed regions 22A therein (FIG. 3C).

The valve 16 is then opened again to introduce the HCl gas 23a into the chamber 1a while the air in the chamber 1a is kept pumped out by the vacuum pump system, resulting in a low-level vacuum condition. The concentration of the HCl gas 23a is controlled to be a given value. The resist film 21 is contacted with the HCl gas 23a again to absorb the gas 23 on the surface area of the film 22 (FIG. 3D).

The wafer 21 with the resist film 22 thus EB-exposed and gas-absorbed twice is moved out of the exposure chamber 1a through the opened gate 14 to the atmosphere. Thus, a plurality of the wafers 21 with the resist film 22 gas-absorbed and EB-exposed are held in the carrier.

The wafers 21 held in the carrier are subjected to the same PEB process as that of the second embodiment for the resist films 22 (FIG. 3E). The given reaction of the resist film 22 is finished during the PEB process.

Finally, the resist film 22 is developed in the same way as that of the second embodiment, resulting in penetrating windows 22B formed in the resist film 22 at corresponding positions to the exposed regions 22A–G (FIG. 3F).

Through the above process sequence, similar to the first, second, third and fourth embodiments, a desirable pattern of the resist film 22 can be obtained. Each of the penetrating windows 22B has vertical walls and does not have a T-shaped cross section.

In the first to fifth embodiments, the positive EB resist containing an acid-generator such as an onium salt and an acid-degradative polymer such as a poly-(p-t butoxycarbonyl oxystyrene) is used; however, a negative EB resist of this type may be used. The negative resist contains, in general, an acid-generator such as a halogenide, an acid-reactive monomer such as a hexamethoxymethylmelamine and an acid-polymerization polymer such as a novolac resin.

An example of the negative resist to be preferably used for the invention is SAL601ER7 (product name) produced by the SHIPLEY CO. LTD.

In the first to fifth embodiments, an HCl gas is used as the acid gas. However any other acid gas may be used and HBr, $H_2SO_4$ or $H_2O_2$ gas may be preferably used.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. In a pattern formation method of an electron-beam resist film with a chemically amplification property by applying an electron-beam to said resist film, said resist film being formed on or over a supporting member;

said method comprising the steps of:
 (a) exposing said resist film to an electron-beam in a vacuum atmosphere to thereby generate a first acid for image formation at exposed regions of said resist film; and
 (b) contacting said resist film with an acid gas to thereby cause said acid gas to be absorbed into a surface area of said resist film;
wherein
 said acid gas absorbed into the surface area of said resist film generates a second acid for compensation during a subsequent heat-treatment process;
and wherein
 said second acid compensates for a reduced catalyst action of said first acid which is caused by contacting said first acid with the atmospheric air; and
 maintaining said resist film free from contact with the atmospheric air between said steps (a) and (b).

2. The method as claimed in claim 1, wherein said step (b) of contacting said resist film with said acid gas is carried out before said step (a) of exposing said resist film to said electron-beam.

3. The method as claimed in claim 1, wherein said step (b) of contacting said resist film with said acid gas is carried out after said step (a) of exposing said resist film to said electron-beam.

4. The method as claimed in claim 1, wherein said step (b) of contacting said resist film with said acid gas is carried out before said step (a) of exposing said resist film to said electron-beam, and said step of (b) is carried out again after said step (a).

5. The method as claimed in claim 1, wherein said step (b) of contacting said resist film with said acid gas is carried out simultaneously with said step (a) of exposing said resist film to said electron-beam.

6. The method as claimed in claim 1, wherein said acid gas is selected from the group consisting of HCl, HBr, $H_2O_2$ and $H_2SO_4$.

7. A pattern formation method comprising the steps of:
 (a) forming an electron-beam resist film with a chemically amplification property on or over a supporting member;
 (b) contacting said resist film with an acid gas in an acid-absorption chamber to cause said acid gas to be absorbed into a surface area of said resist film;
 (c) placing said supporting member with said resist film containing said acid gas in an exposure chamber;
 (d) applying an electron-beam to said resist film containing said acid gas in said exposure chamber to generate a first acid for image formation at exposed regions of said resist film, said first acid being generated by said resist film;
 (e) transferring said supporting member with said resist film thus exposed from said exposure chamber to said acid-absorption chamber while maintaining said resist film free from contact with atmospheric air;
 (f) contacting said resist film exposed to said electron-beam with said acid gas again in said acid-absorption chamber to cause said gas absorbed in the surface area of said resist film; and
 (g) heat-treating said resist film contacted with said acid gas twice; and
 (h) developing said resist film thus heat-treated to obtain a given pattern of said resist film;
wherein
 said acid gas absorbed in the surface area of said resist film generates a second acid for compensation during said heat-treating step (g);
and wherein
 said second acid compensates for a reduced catalyst action of said first acid which is caused by contacting said first acid with the atmospheric air.

8. The method as claimed in claim 7, wherein said acid gas is selected from the group consisting of HCl, HBr, $H_2O_2$ and $H_2SO_4$.

9. A pattern formation method comprising the steps of:
 (a) forming an electron-beam resist film with a chemically amplification property on or over a supporting member;
 (b) placing said supporting member with said resist film in an exposure chamber;
 (c) applying an electron-beam to said resist film in said exposure chamber to generate a first acid for image formation at exposed regions of said resist film, said first acid being generated by said resist film;
 (d) taking said supporting member with said resist film thus exposed out of said exposure chamber;
 (e) contacting said resist film exposed to said electron-beam with an acid gas to cause said gas to be absorbed in a surface area of said resist film outside said exposure chamber; and
 (f) heat-treating said resist film contacted with said acid gas; and
 (g) developing said resist film thus heat-treated to obtain a given pattern of said resist film;
wherein
 said acid gas absorbed in the surface area of said resist film generates a second acid for compensation during said heat-treatment step (f);
and wherein
 said second acid compensates a reduced catalyst action of said first acid which is caused by contacting said first acid with the atmospheric air.

10. The method as claimed in claim 9, wherein said acid gas is selected from the group consisting of HCl, HBr, $H_2 O_2$ and $H_2SO_4$.

11. A pattern formation method comprising the steps of:
 (a) forming an electron-beam resist film with a chemically amplification property on or over a supporting member;
 (b) placing said supporting member with said resist film in an exposure chamber;

(c) applying an electron-beam to said resist film in said exposure chamber to generate a first acid for image formation at exposed regions of said resist film, said first acid being generated by said resist film;

(d) taking said supporting member with said resist film thus exposed out of said exposure chamber;

(e) contacting said resist film exposed to said electron-beam with an acid gas to cause said gas absorbed in a surface of said resist film outside said exposure chamber;

(f) heat-treating said resist film contacted with said acid gas; and (g) developing said resist film thus heat-treated to obtain a given pattern of said resist film;

wherein said acid gas absorbed in the surface of said resist film generates a second acid for compensation during said heat-treatment step (f);

and wherein said second acid compensates a reduced catalyst action of said first acid which is caused by contacting said first acid with the atmospheric air.

12. The method as claimed in claim 11, wherein said acid gas is selected from the group consisting of HCl, HBr, $H_2O_2$ and $H_2SO_4$.

13. A pattern formation method comprising the steps of:

(a) forming an electron-beam resist film with a chemically amplification property on or over a supporting member;

(b) introducing an acid gas into an exposure chamber;

(c) placing said supporting member with said resist film in said exposure chamber containing said acid gas, causing said acid gas to be absorbed in a surface area of said resist film;

(d) applying an electron-beam to said resist film containing said acid gas in said exposure chamber in the presence of said acid gas to generate a first acid for image formation at exposed regions of said resist film, said first acid being generated by said resist film;

(e) taking said supporting member with said resist film thus exposed out of said exposure chamber;

(f) heat-treating said resist film thus exposed outside said exposure chamber; and (g) developing said resist film thus heat-treated to obtain a given pattern of said resist film;

wherein said acid gas absorbed in the surface of said resist film generates a second acid for compensation during said heat-treatment step (f);

and wherein said second acid compensates a reduced catalyst action of said first acid which is caused by contacting said first acid with the atmospheric air.

14. The method as claimed in claim 13, wherein said acid gas is selected from the group consisting of HCl, HBr, $H_2O_2$ and $H_2SO_4$.

15. A pattern formation method comprising the steps of:

(a) forming an electron-beam resist film with a chemically amplification property on or over a supporting member;

(b) introducing an acid gas into an exposure chamber;

(c) placing said supporting member with said resist film in said exposure chamber, causing said acid gas to be absorbed in a surface area of said resist film;

(d) discharging said acid gas from said exposure chamber after said step (c);

(e) applying an electron-beam to said resist film in said exposure chamber to generate a first acid for image formation at exposed regions of said resist film, said first acid being generated by said resist film;

(f) taking said supporting member with said resist film thus exposed out of said exposure;

(g) heat-treating said resist film contacted with said acid gas outside said exposure chamber; and (h) developing said resist film thus heat-treated to obtain a given pattern of said resist film;

wherein said acid gas absorbed on said resist film produces a second acid that compensates an action of said first acid to be lost due to deactivation.

16. The method as claimed in claim 15, wherein said acid gas is selected from the group consisting of HCl, HBr, $H_2O_2$ and $H_2SO_4$.

17. A pattern formation method comprising the steps of:

(a) forming an electron-beam resist film with a chemically amplification property on or over a supporting member;

(b) placing said supporting member with said resist film in an exposure chamber;

(c) applying an electron-beam to said resist film in said exposure chamber to generate a first acid at exposed regions of said resist film, said first acid being produced by said resist film;

(d) introducing an acid gas into said exposure chamber so that said acid gas is absorbed on said resist film thus exposed;

(e) taking said supporting member with said resist film containing said acid gas out of said exposure chamber;

(f) heat-treating said resist film contacted with said acid gas outside said exposure chamber; and (g) developing said resist film thus heat-treated to obtain a given pattern of said resist film;

wherein said acid gas absorbed in the surface area of said resist film generates a second acid for compensation during said heat-treatment step (f);

and wherein said second acid compensates for a reduced catalyst action of said first acid which is caused by contacting said first acid with the atmospheric air.

18. The method as claimed in claim 17, wherein said acid gas is selected from the group consisting of HCl, HBr, $H_2O_2$ and $H_2SO_4$.

19. A pattern formation method comprising the steps of:

(a) forming an electron-beam resist film with a chemically amplification property on or over a supporting member;

(b) introducing an acid gas into an exposure chamber;

(c) placing said supporting member with said resist film in said exposure chamber containing said acid gas, causing said acid gas to be absorbed in a surface area of said resist film;

(d) discharging said acid gas from said exposure chamber after said step (c);

(e) applying an electron-beam to said resist film containing said acid gas in said exposure chamber to generate a first acid for image formation at exposed regions of said resist film, said first acid being generated by said resist film;

(f) introducing said acid gas into said exposure chamber again, causing said acid gas to be absorbed in the surface area of said resist film after said step (e);

(g) taking said supporting member with said resist film contacted with said acid gas twice out of said exposure chamber;

(h) heat-treating said resist film thus contacted with said acid gas twice outside said exposure chamber; and (i) developing said resist film thus heat-treated to obtain a given pattern of said resist film;

wherein said acid gas absorbed in the surface area of said resist film generates a second acid for compensation during said heat-treatment step (g);

and wherein said second acid compensates for a reduced catalyst action of said first acid which is caused by contacting said first acid with the atmospheric air.

20. The method as claimed in claim 19, wherein said acid gas is selected from the group consisting of $HCl$, $HBr$, $H_2O_2$ and $H_2SO_4$.

* * * * *